(12) United States Patent
Oh

(10) Patent No.: US 7,265,384 B2
(45) Date of Patent: Sep. 4, 2007

(54) THIN FILM TRANSISTOR AND ORGANIC ELECTROLUMINESCENCE DISPLAY USING THE SAME

(75) Inventor: Sang-Hun Oh, Suwon-si (KR)

(73) Assignee: Samsung SDI Co., Ltd., Suwon-Si (KR)

(*) Notice: Subject to any disclaimer, the term of this patent is extended or adjusted under 35 U.S.C. 154(b) by 0 days.

(21) Appl. No.: 11/095,601

(22) Filed: Apr. 1, 2005

(65) Prior Publication Data

US 2005/0242348 A1 Nov. 3, 2005

(30) Foreign Application Priority Data

Apr. 28, 2004 (KR) .................. 10-2004-0029508

(51) Int. Cl.
*H01L 29/04* (2006.01)
*H01L 29/15* (2006.01)

(52) U.S. Cl. .................. 257/59; 257/72; 257/344; 438/48; 438/128; 438/149; 438/151; 438/157; 438/283

(58) Field of Classification Search .............. 257/72, 257/59, E27.1, 344; 349/42–44; 438/48, 438/128, 149, 151, 157, 283

See application file for complete search history.

(56) References Cited

U.S. PATENT DOCUMENTS

| | | | | |
|---|---|---|---|---|
| 5,585,647 A | * | 12/1996 | Nakajima et al. | 257/72 |
| 5,821,565 A | * | 10/1998 | Matsuzaki et al. | 257/72 |
| 6,563,136 B2 | * | 5/2003 | Kunii | 257/72 |
| 6,835,586 B2 | * | 12/2004 | Yamazaki et al. | 438/48 |
| 6,909,114 B1 | * | 6/2005 | Yamazaki | 257/66 |
| 2004/0206956 A1 | * | 10/2004 | Yanai et al. | 257/59 |

* cited by examiner

Primary Examiner—Kenneth Parker
Assistant Examiner—Joseph Nguyen
(74) Attorney, Agent, or Firm—H.C. Park & Associates, PLC

(57) ABSTRACT

A thin film transistor (TFT) having a lightly doped drain (LDD) structure includes a lightly doped drain (LDD) region formation pattern, an active layer formed in an uneven structure on the LDD region formation pattern, and having a source region and a drain region having an LDD region. A gate electrode may be formed on a gate insulating layer, and source and drain electrodes are coupled to the source and drain regions.

18 Claims, 8 Drawing Sheets

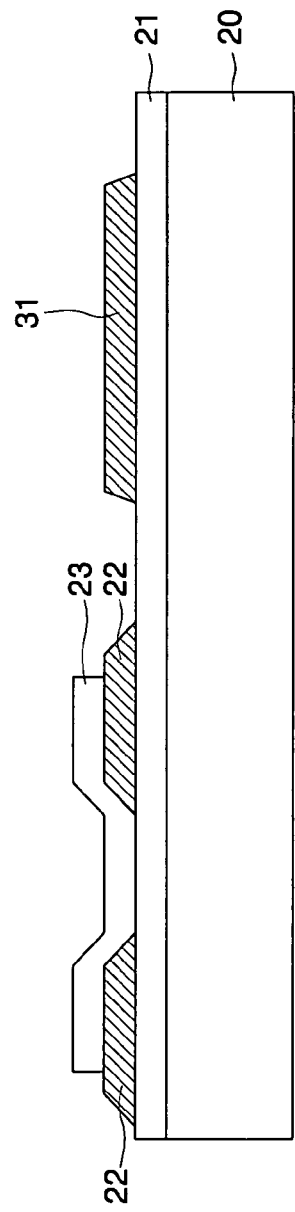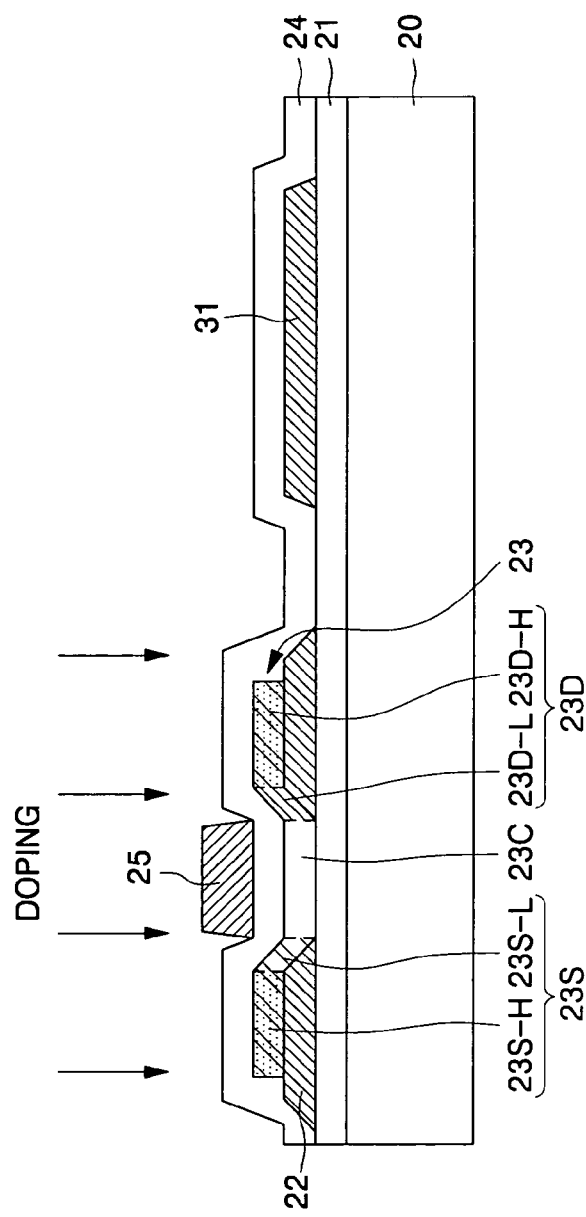

THIN FILM TRANSISTOR AND ORGANIC ELECTROLUMINESCENCE DISPLAY USING THE SAME

CROSS-REFERENCE TO RELATED APPLICATION

This application claims priority to and the benefit of Korean Patent Application No. 10-2004-0029508, filed Apr. 28, 2004, which is hereby incorporated by reference for all purposes as if fully set forth herein.

BACKGROUND OF THE INVENTION

1. Field of the Invention

The present invention relates to a thin film transistor (TFT) and an electroluminescence display using the same and, more particularly, to a TFT having a lightly doped drain (LDD) structure and an organic electroluminescence display using the same.

2. Discussion of the Background

Generally, in an active matrix organic electroluminescence display that uses a TFT as a switching device, a pixel driving TFT may be formed in each pixel to drive the pixel, and a TFT may be used in a driving circuit that drives the pixel driving TFT and applies a signal to a scan line (i.e., gate line) and a signal line (i.e., data line).

A polycrystalline silicon TFT may be fabricated at a temperature similar to an amorphous silicon TFT, and it may have higher electron or hole mobility compared to the amorphous silicon TFT. Additionally, it may be possible to implement a complementary metal-oxide semiconductor (CMOS) TFT having an n-channel and a p-channel so that the driving circuit TFT and the pixel driving TFT may be simultaneously formed on a large-sized insulating substrate.

However, in an NMOS TFT of the CMOS polycrystalline silicon TFT, phosphorus (P) is typically used as a doping ion, and because phosphorus has mass relatively larger than that of boron (B), which is typically used for fabricating a PMOS TFT, silicon crystal may be destroyed, resulting in a damaged region. The damaged region may not be fully recovered even in subsequent activation processes.

This damaged region may cause hot carrier stress, in which electrons may penetrate a gate insulating layer or a MOS interface when they accelerate from a source region to a drain region. Furthermore, the hot carrier stress may reduce electron mobility, which adversely affects stability of circuit operation in the organic electroluminescence display, and may increase an off current.

In order to solve this problem, a method for forming a lightly doped drain (LDD) and a LDD structure has been suggested in which certain portions of source and drain regions are doped at a low concentration to reduce an off-current and minimize a reduction in on current.

FIG. 1A, FIG. 1B and FIG. 1C are cross-sectional views showing a TFT with a conventional LDD structure.

Referring to FIG. 1A, a polycrystalline silicon (poly-Si) layer may be formed by depositing and crystallizing amorphous silicon on an insulating substrate 10 having a buffer layer 11 using plasma enhanced chemical vapor deposition (PECVD), low pressure chemical vapor deposition (LPCVD), sputtering, or other like methods.

After forming the poly-Si layer, photoresist may then be formed on it to form an active layer, and an active layer 12 may be formed by patterning the poly-Si layer using the photoresist as a mask.

A gate insulating layer 13 may then be deposited on the active layer 12, and a gate metal may be deposited on the gate insulating layer 13. A gate electrode 14 may then be formed by patterning the gate metal.

After forming the gate electrode 14, low concentration doping may be carried out using the gate electrode 14 as a mask to form an LDD region in the active layer, thus defining source and drain regions 12S and 12D. A region between the source and drain regions 12S and 12D acts as a channel region 12C of the TFT.

Referring to FIG. 1B, after forming the source and drain regions 12S and 12D, a photoresist pattern 15, for forming the source and drain regions 12S and 12D having the LDD region of the TFT, may be formed by applying and exposing photoresist on the insulating substrate 10.

After forming the photoresist pattern 15, LDD regions 12S-L and 12D-L and highly doped regions 12S-H and 12D-H may be formed by performing high concentration doping into the active layer using the photoresist pattern 15 as a mask.

Referring to FIG. 1C, after the high concentration doping, contact holes 16a, which expose a portion of the source and drain regions 12S and 12D, may be formed by forming and patterning an interlayer insulating layer 16 on an entire surface of the insulating substrate 10 having the gate electrode 14.

Next, a conductive layer may be deposited on the entire surface of the insulating substrate 10 and be subjected to photolithography to form source and drain electrodes 17S and 17D, which are electrically connected to the source and drain regions 12S and 12D via the contact holes 16a, thereby forming the TFT.

However, forming the TFT as described above requires a separate mask process to form the LDD region, which increases manufacturing time and cost.

SUMMARY OF THE INVENTION

The present invention provides a TFT having an LDD structure, and an organic electroluminescence display using the same, that may be formed without using a separate mask.

Additional features of the invention will be set forth in the description which follows, and in part will be apparent from the description, or may be learned by practice of the invention.

The present invention discloses a TFT comprising a lightly doped drain (LDD) region formation pattern and an active layer formed in an uneven structure on the LDD region formation pattern, and having a source region and a drain region including an LDD region The present invention also discloses a display comprising a lightly doped drain (LDD) region formation pattern and a pixel electrode formed on a same layer on an insulating substrate, an active layer formed in an uneven structure on the LDD region formation pattern, and having a source region and a drain region including an LDD region, a gate electrode formed on a gate insulating layer, and a source electrode and a drain electrode coupled to the source and drain regions, respectively. Either the source electrode or the drain electrode is coupled to the pixel electrode.

The present invention also discloses a TFT comprising a source electrode and a drain electrode formed on an insulating substrate, and an active layer formed in an uneven structure on the source electrode and the drain electrodes and having a source region and a drain region including an LDD region.

The present invention also discloses a display comprising a source electrode, a drain electrode, and a pixel electrode formed on a same layer on an insulating substrate, and an active layer having a source region and a drain region including an LDD region, and formed in an uneven structure on the source and drain electrodes. A gate insulating layer is formed on an entire surface of the insulating substrate having the active layer, and a gate electrode is formed on the gate insulating layer. An insulating layer is formed on an entire surface of the insulating substrate having the gate electrode, and it has an opening that defines an emission region by exposing a portion of the pixel electrode. An organic layer is formed on the opening of the insulating layer, and an upper electrode is formed on an entire surface of the insulating substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2A, FIG. 2B, FIG. 2C and FIG. 2D are cross-sectional views showing a manufacturing process of an organic electroluminescence display according to a first exemplary embodiment of the present invention.

DETAILED DESCRIPTION OF THE ILLUSTRATED EMBODIMENTS

Figure 1A:
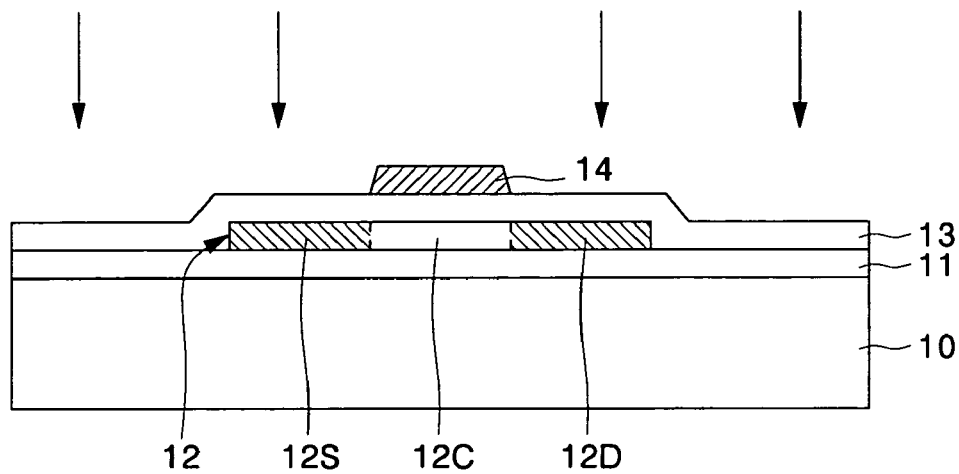
FIG. 1A, FIG. 1B and FIG. 1C are cross-sectional views showing a manufacturing process of a TFT having a conventional LDD structure.
Figure 1B:
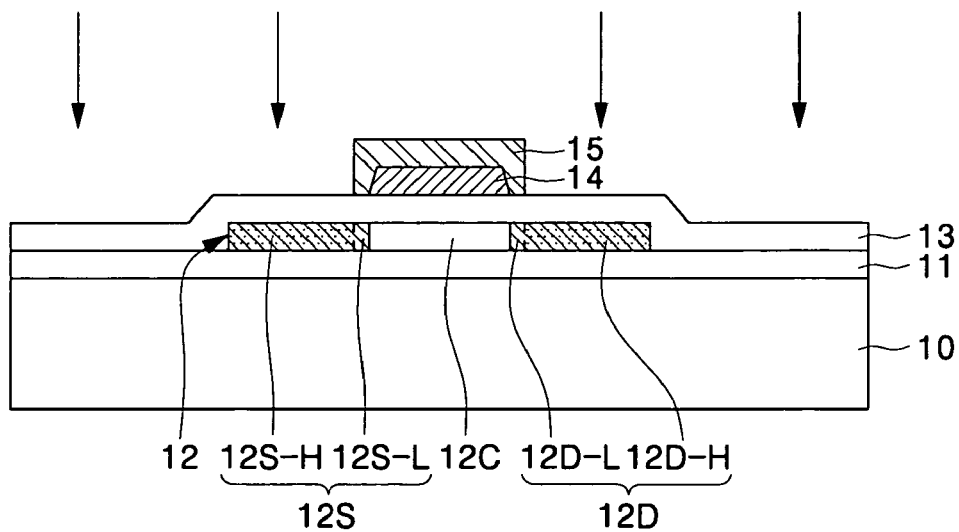
Figure 1C:
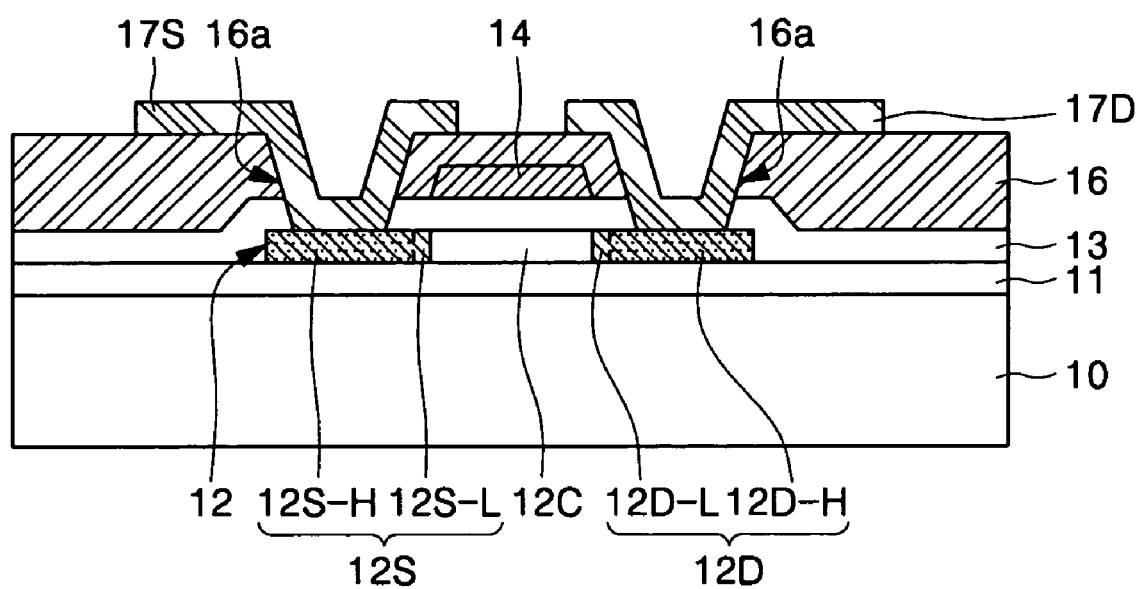

Hereinafter, exemplary embodiments of the present invention will be described with reference to the accompanying drawings.

FIG. 2A, FIG. 2B, FIG. 2C and FIG. 2D are cross-sectional views showing a manufacturing process of an organic electroluminescence display according to a first exemplary embodiment of the present invention.

Referring to FIG. 2A, a buffer layer 21 (or, diffusion barrier) may be deposited on an insulating substrate 20 by PECVD, LPCVD, sputtering, or other like methods. The buffer layer 21 may prevent insulating substrate impurities, such as metal ions, from diffusing and penetrating a poly-Si active layer.

While a glass or plastic substrate may be used as the insulating substrate 20, glass is preferable.

After forming the buffer layer 21, a pixel electrode 31 and an LDD region formation pattern 22 may be formed on the buffer layer 21 by depositing and patterning a transparent conductive material, such as ITO, IZO or other like materials.

Edge portions of the pixel electrode 31 and the LDD region formation pattern 22 may have a taper angle of about 10° to about 45°.

Next, an amorphous silicon layer may be deposited on an entire surface of the insulating substrate by PECVD, LPCVD, sputtering, or other like methods. The amorphous silicon layer may be unevenly formed along the shape of the LDD region formation pattern 22 because the amorphous silicon layer on the edge portion of the LDD region formation pattern 22 may be formed along the edge portion's taper angle.

A dehydrogenation process may be carried out in a vacuum furnace after forming the amorphous silicon layer. The dehydrogenation process may not be carried out when the amorphous silicon layer is deposited by the LPCVD or sputtering method.

A poly-Si layer may be formed by crystallizing the amorphous silicon layer through an amorphous silicon crystallization process in which high energy is irradiated to the amorphous silicon layer. A crystallization process using a laser, such as excimer laser annealing (ELA), sequential lateral solidification (SLS) or other like processes, may be employed as the crystallization process.

After crystallization, a portion of the poly-Si layer on the edge portion of the LDD region formation pattern 22 may have a lower crystallinity than a portion of the poly-Si layer on the other portion of the LDD region formation pattern 22. This is because the portion of the amorphous silicon layer on the edge portion of the LDD region formation pattern 22 may be thicker than the portion of the amorphous silicon layer on the other portion of the LDD region formation pattern 22.

After forming the poly-Si layer, photoresist may be formed on the poly-Si layer. Patterning the poly-Si layer using the photoresist as a mask forms an active layer 23.

The active layer 23 may be uneven due to the below LDD region formation pattern 22. A portion of the active layer 23 on the edge portion of the LDD region formation pattern 22 may be formed in a shape inclined by 10° to 45° according to the taper angle of the edge portion of the LDD region formation pattern 22.

Referring to FIG. 2B, after forming the active layer 23, a gate electrode 25 may be formed by depositing a gate insulating layer 24 on the active layer 23, depositing a gate metal on the gate insulating layer 24, and then patterning the gate metal.

Next, source and drain regions 23S and 23D may be formed by doping impurity ions at a high concentration into the active layer 23 using the gate electrode 25 as a mask. A region between the source and drain regions 23S and 23D acts as the TFT's channel region 23C.

An inclined portion of the source and drain regions 23S and 23D on the edge portion of the LDD region formation pattern 22 may act as a region having a lower doping concentration, namely, LDD regions 23S-L and 23D-L, as compared to other portions 23S-H and 23D-H of the source and drain regions 23S and 23D on the other portions of the LDD region formation pattern 22. Portions of the source and drain regions 23S and 23D on the other portions of the LDD region formation pattern 22 may act as highly doped regions 23S-H and 23D-H.

This is because the inclined portion of the active layer 23 on the edge portion of the LDD region formation pattern 22 may have less crystallinity than the non-inclined portions of the active layer 23 formed on other portions of the LDD region formation pattern 22, resulting in a lower doping degree of impurity.

Figure 2C:
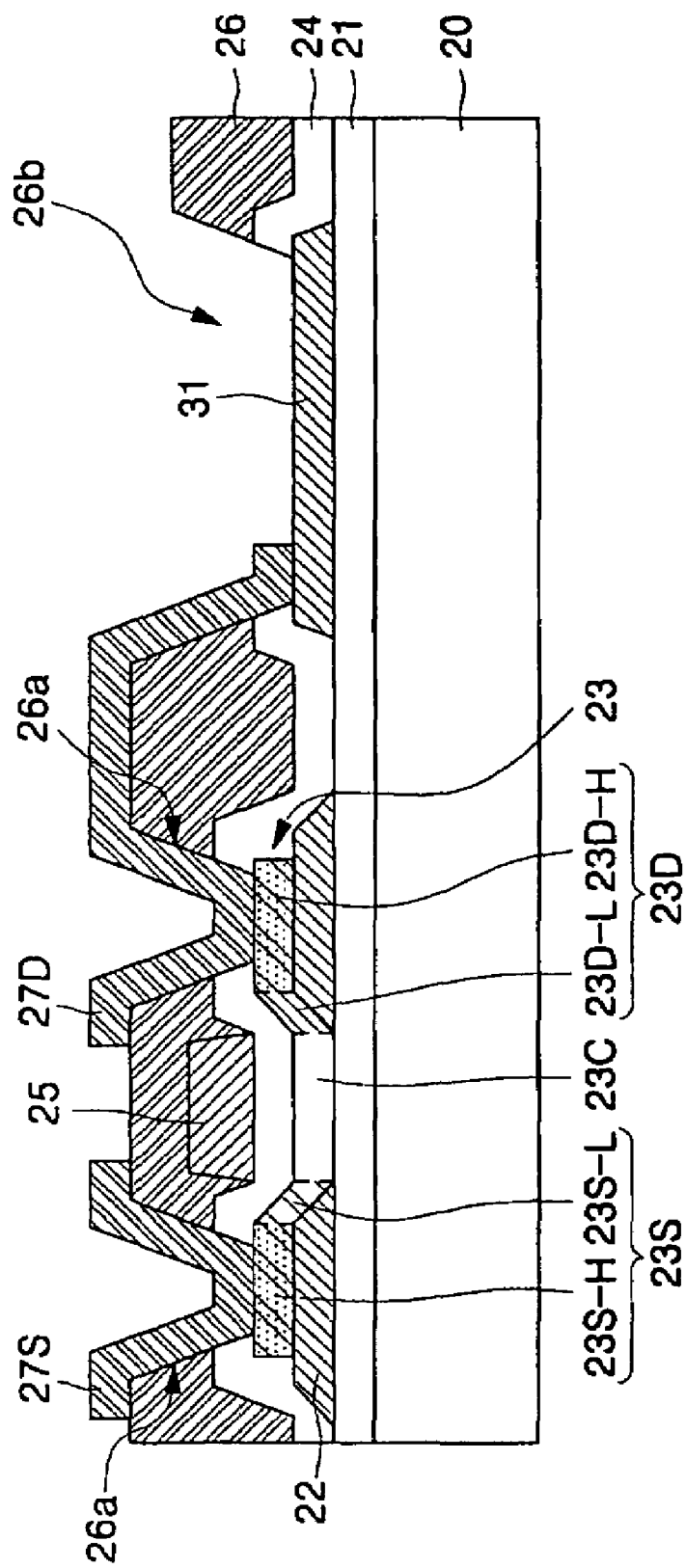

Referring to FIG. 2C, after forming the source and drain regions 23S and 23D with the LDD regions 23S-L and 23D-L, an interlayer insulating layer 26 may be formed on the entire surface of the insulating substrate 10 having the gate electrode 25.

An activation process may then be performed in which doped impurities in the active layer 23 are further activated through annealing in a furnace.

After performing the annealing process, contact holes 26a, which expose a portion of the source and drain regions 23S and 23D, may be formed by patterning the interlayer insulating layer 26, while simultaneously forming an opening 26b exposing the pixel electrode 31.

Next, source and drain electrodes 27S and 27D, which are coupled to the source and drain regions 23S and 23D via the contact holes 26a, may be formed by depositing and patterning a conductive layer on the entire surface of the insulating substrate 20, thus forming the TFT.

Further, either the source electrode or the drain electrode 27S, 27D may be coupled to the pixel electrode 31 via the opening 26b. The exemplary embodiment of FIG. 2C shows the drain electrode 27D coupled to the pixel electrode 31.

Figure 2D:
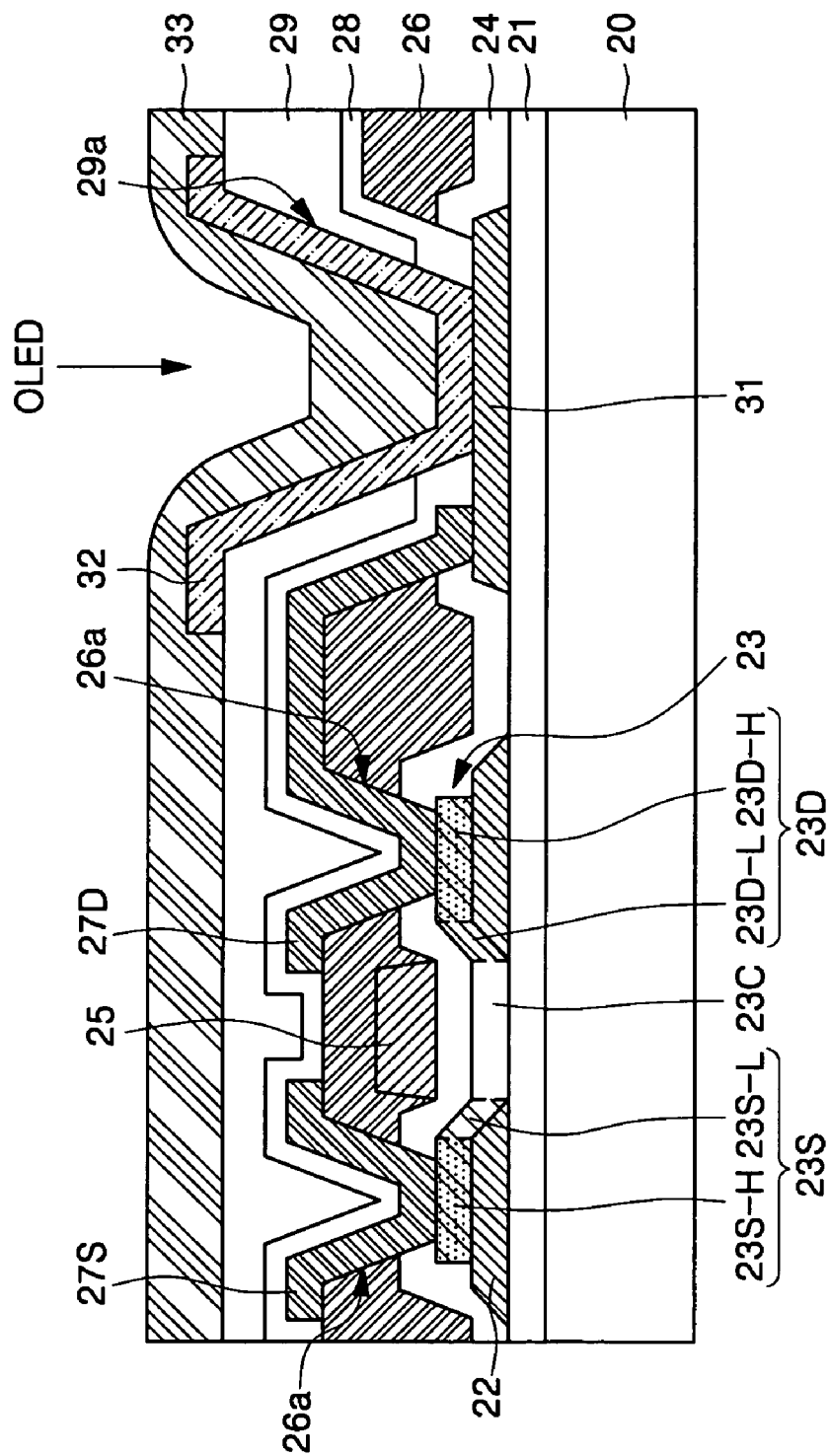

Referring to FIG. 2D, after forming the source and drain electrodes 27S and 27D, a passivation layer 28 may be formed on the entire surface of the insulating substrate. The passivation layer 28 may be formed by CVD or other like methods, and it may be made of $SiO_2$ or SiNx.

Next, an annealing process may be carried out to enhance the TFT's characteristics by curing damage arising during the fabrication process.

After annealing, a planarization layer 29 may be formed to remove a step of the lower structure. The planarization layer 29 may be formed of acryl, polyimide (PI), polyamide (PA), benzocyclobutene (BCB), or other like materials.

Next, an opening 29a that exposes a portion of the pixel electrode 31 may be formed to define an emission region of the organic light emitting device OLED.

An organic layer 32 may then be formed on the entire surface of the insulating substrate 20 including the pixel electrode 31. The organic layer 32 may comprise several layers according to its function. Generally, in addition to an emission layer, the organic layer 32 may comprise a multi-layered structure including at least one of a hole injecting layer (HIL), a hole transporting layer (HTL), a hole blocking layer (HBL), an electron transporting layer (ETL), and an electron injecting layer (EIL).

The emission layer emits light having a specific wavelength when electrons and holes, which are injected from a cathode and an anode of the organic electroluminescence device OLED, recombine. At least one of an HIL, HTL, HBL, ETL, EIL, and the like, which have charge transporting capability, may be selectively inserted between an electrode and the emission layer to obtain highly efficient emission.

When the pixel electrode 31 of the organic electroluminescence device acts as an anode electrode, a subsequently formed upper electrode may act as a cathode electrode. In this case, an HIL and an HTL may be positioned between the pixel electrode 31 and the emission layer, and an HBL, an ETL and an EIL may be positioned between the emission layer and the subsequently formed upper electrode.

Further, when the pixel electrode 31 acts as a cathode electrode, the subsequently formed upper electrode may act as an anode electrode, resulting in an organic layer arrangement that may be opposite to the above-described arrangement.

Such an organic layer 32 including the emission layer may be formed by a wet coating method in which coating is performed in a solution state, such as spin coating, deep coating, spray, screen printing, inkjet printing, or other like methods, or by a dry coating method, such as sputtering, vacuum deposition, or other like methods.

After forming the organic layer 32, an upper electrode 33 may then be formed on the organic layer 32, thus forming the organic light emitting device OLED including the pixel electrode 31, the organic layer 32 and the upper electrode 33.

Although not shown in the drawings, an upper substrate may encapsulate the organic light emitting device OLED.

Figure 3A:
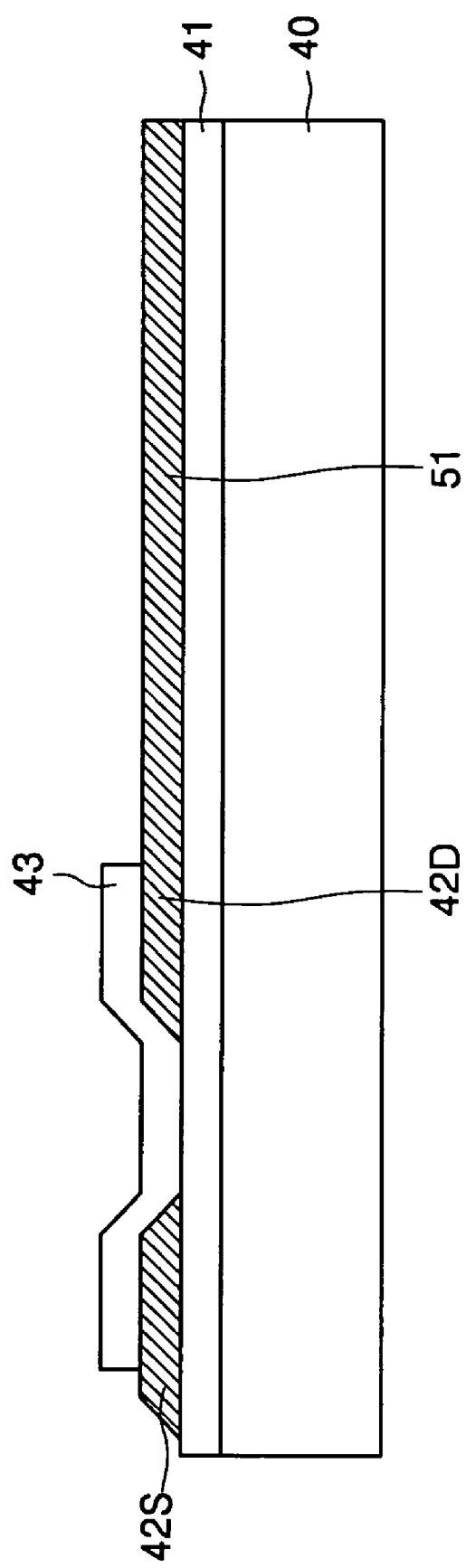
FIG. 3A, FIG. 3B and FIG. 3C are cross-sectional views showing a manufacturing process of an organic electroluminescence display according to a second exemplary embodiment of the present invention.
Figure 3B:
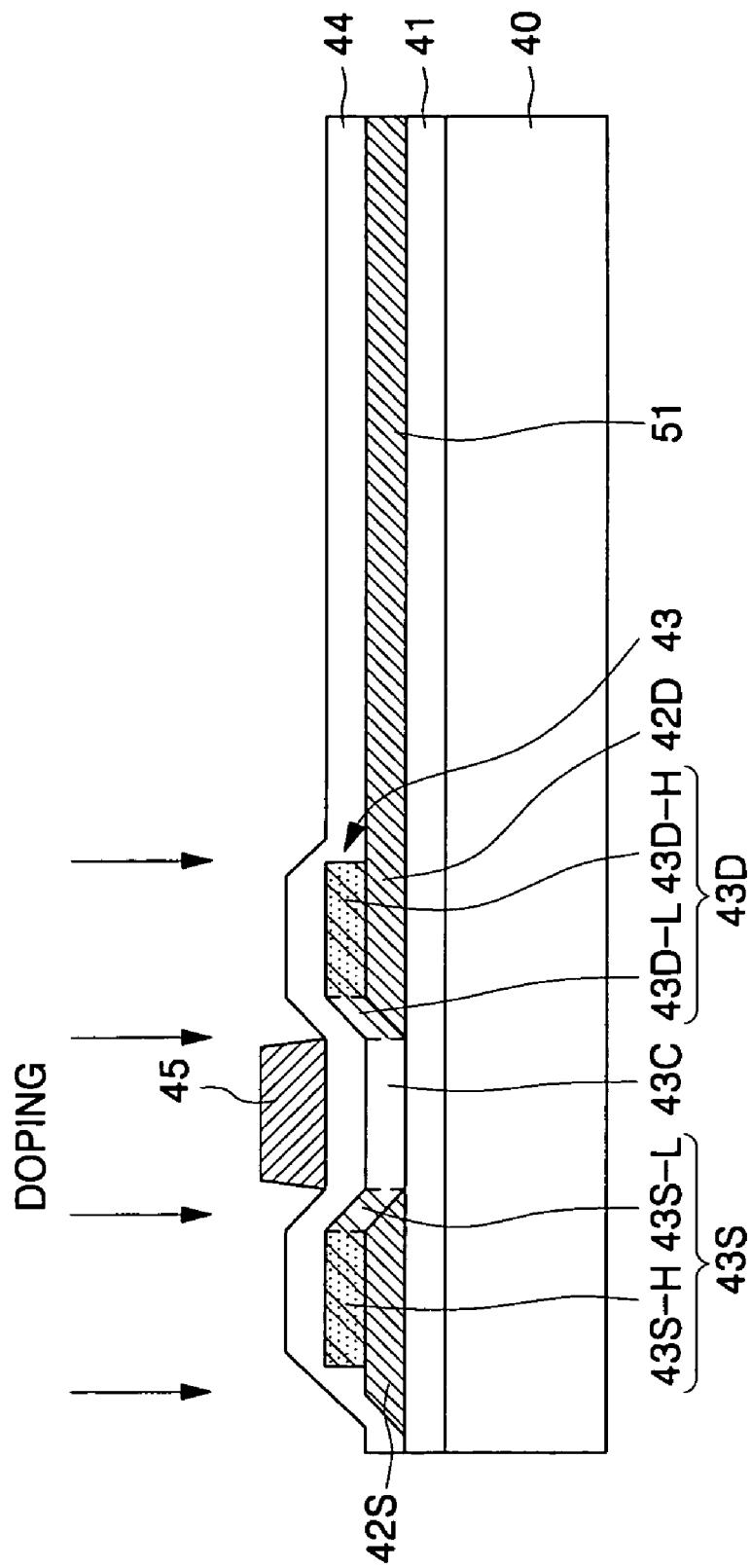
Figure 3C:
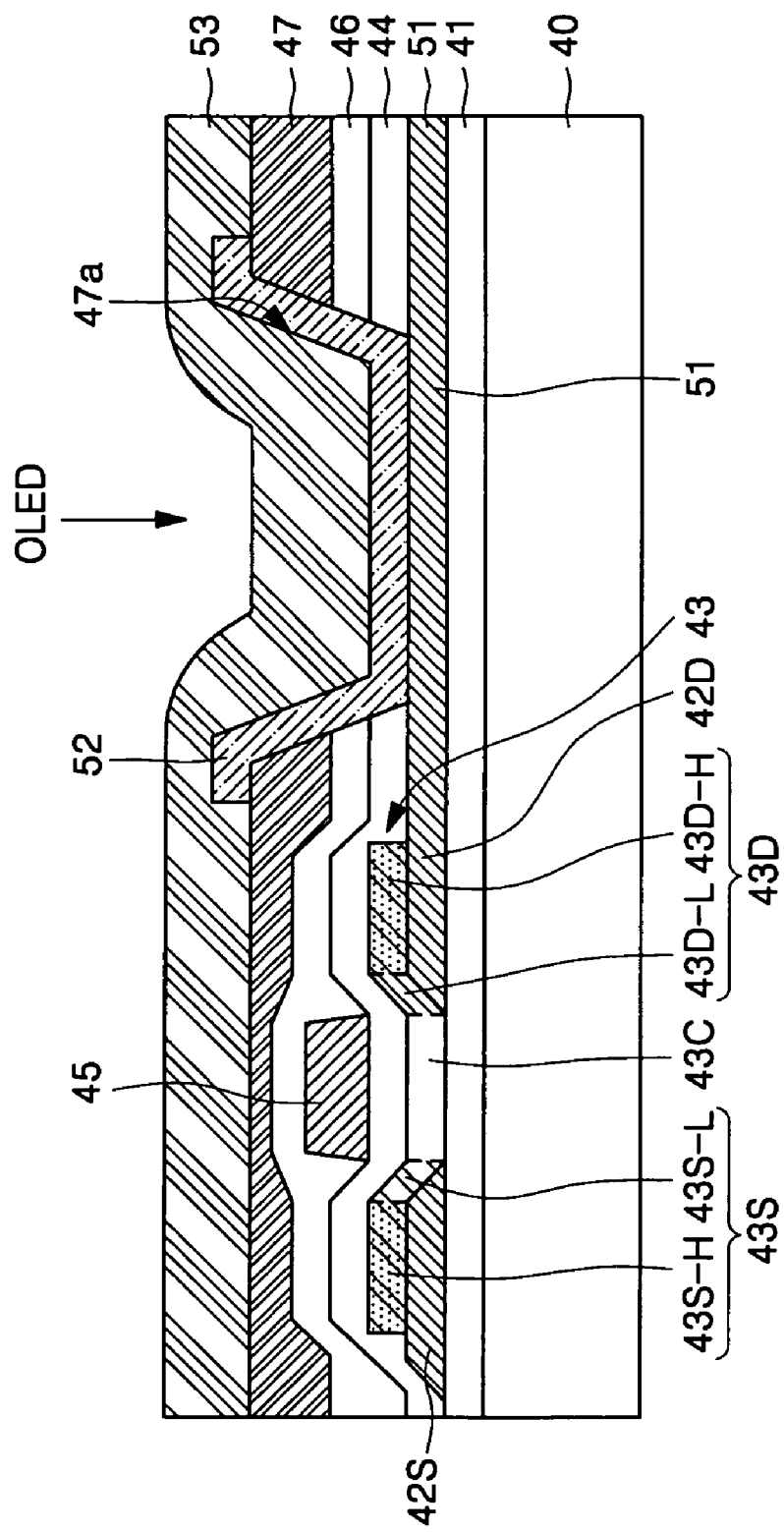

FIG. 3A, FIG. 3B and FIG. 3C are cross-sectional views showing a manufacturing process of an organic electroluminescence display according to a second exemplary embodiment of the present invention.

Referring to FIG. 3A, a transparent conductive material, such as ITO, IZO, or other like material, may be deposited and patterned on an insulating substrate 40 having a buffer layer 41 to form source and drain electrodes 42S and 42D and a pixel electrode 51.

Edge portions of the source and drain electrodes 42S and 42D and the pixel electrode 51 may have a taper angle of about 10° to about 45°.

Similar to the first embodiment, an active layer 43 of the TFT may then be formed by depositing an amorphous silicon layer, and forming and patterning a poly-Si layer through a crystallization process using a laser.

After the crystallization process, a portion of the poly-Si layer on the inclined edge portions of the source and drain electrodes 42S and 42D may have less crystallinity than a portion of the poly-Si layer that is not on the inclined edge portions of the source and drain electrodes 42S and 42D.

The active layer 43 may be unevenly formed due to the below source and drain electrodes 42S and 42D.

Referring to FIG. 3B, after forming the active layer 43, a gate electrode 45 may be formed by depositing a gate insulating layer 44 on the active layer 43, depositing a gate metal on the gate insulating layer 44, and patterning the gate metal.

Next, source and drain regions 43S and 43D may be formed by doping impurity ions at a high concentration into the active layer 43 using the gate electrode 45 as a mask. A region between the source and drain regions 43S and 43D acts as the TFT's channel region 43C.

Inclined portions of the source and drain regions 43S and 43D on the edge portions of the source and drain electrodes 42S and 42D become regions having a lower doping concentration, namely, LDD regions 43S-L and 43D-L, as compared to portions 43S-H and 43D-H of the source and drain regions 43S and 43D on other portions of the source and drain electrodes 42S and 42D. The portions 43S-H and 43D-H of the source and drain regions 43S and 43D on the source and drain electrodes 42S and 42D may act as highly doped regions 43S-H and 43D-H.

Referring to FIG. 3C, after forming the source and drain regions 43S and 43D having the LDD regions 43S-L and 43D-L, a passivation layer 46, which may be made of $SiO_2$ or SiNx, may be formed on an entire surface of the insulating substrate 40 having the gate electrode 45.

An annealing process may then be carried out in a furnace to further activate the impurities doped into the active layer 43 and enhance the TFT's characteristics by curing a damaged region arising in the TFT manufacturing process.

A planarization layer 47 may be formed on the entire surface of the insulating substrate 40 after performing the annealing process. Similar to the first exemplary embodiment, the planarization layer 47 may be made of acryl, polyimide (PI), polyamide (PA), benzocyclobutene (BCB), or other like materials.

An opening 47a may then be formed to expose a portion of the pixel electrode 51 and define an emission region of the organic light emitting device OLED.

After forming the opening 47a, an organic layer 52 may be formed on the pixel electrode 51, similarly to the first exemplary embodiment.

Next, an upper electrode 53 may be formed on the organic layer 52, thus forming the organic light emitting device OLED including the pixel electrode 51, the organic layer 52, and the upper electrode 53.

Although not shown, an upper substrate may encapsulate the organic light emitting device OLED.

For the TFT formed as described above, the LDD region may be formed using one doping process and without a separate additional mask.

As described above, according to exemplary embodiments of the present invention, a TFT having an LDD structure and an organic electroluminescence display using the same may be achieved without adding a separate mask.

While the exemplary embodiments described above show an organic electroluminescence display, the present invention is not limited thereto and the TFT of the present invention may be utilized in any device using a TFT.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin film transistor (TFT), comprising:
   a source electrode and a drain electrode formed on a substrate, at least one of the source electrode and the drain electrode having an inclined edge portion; and
   an active layer formed in an uneven structure on the source electrode and the drain electrode, and having a source region and a drain region, at least one of the source region and the drain region including an LDD region,
   wherein the LDD region is contained entirely within an inclined portion of the active layer
   wherein the inclined portion of the active layer corresponds to the inclined edge portion of the at least one of the source electrode and the drain electrode.

2. The TFT of claim 1, wherein the source electrode and the drain electrode are formed of a transparent conductive material.

3. The TFT of claim 1, wherein the source electrode and the drain electrode have the inclined edge portion with a taper angle of about 10° to about 45°.

4. The TFT of claim 1, wherein the inclined portion of the active layer is on the inclined edge portion of the at least one of the source electrode and the drain electrode.

5. The TFT of claim 1, wherein the LDD region has less crystallinity than a remaining portion of the source region and the drain region.

6. The TFT of claim 1, further comprising a buffer layer formed on the substrate.

7. The TFT of claim 1, wherein the substrate is one of a glass substrate and a plastic substrate.

8. A display, comprising:
   a source electrode, a drain electrode, and a pixel electrode formed on a same layer on a substrate;
   an active layer having a source region and a drain region including an LDD region, and formed in an uneven structure on the source electrode and the drain electrode;
   a gate insulating layer formed on an entire surface of the substrate having the active layer;
   a gate electrode formed on the gate insulating layer;
   an insulating layer formed on an entire surface of the substrate having the gate electrode, and having an opening that defines an emission region by exposing a portion of the pixel electrode;
   an organic layer formed on the opening of the insulating layer; and
   an upper electrode formed on an entire surface of the substrate.

9. The display of claim 8, wherein either the source electrode or the drain electrode is integrally formed with the pixel electrode.

10. The display of claim 8, wherein the source electrode and the drain electrode are formed of a transparent conductive material.

11. The display of claim 8, wherein the source electrode and the drain electrode have an edge portion with a taper angle of about 10° to about 45°.

12. The display of claim 8, where in the LDD region is formed in an inclined region of the active layer on an edge portion of the source electrode and the drain electrode.

13. The display of claim 8, wherein the LDD region has less crystallinity than a remaining portion of the source region and the drain region.

14. The display of claim 8, further comprising a buffer layer formed on the substrate.

15. The display of claim 8, wherein the insulating layer comprises:
   a passivation layer formed of an inorganic material; and
   a planarization layer formed of an organic material.

16. The display of claim 15, wherein the passivation layer is a silicon dioxide ($SiO_2$) layer or a silicon nitride ($SiN_x$) layer.

17. The display of claim 15, wherein the planarization layer is formed of one of acryl, polyimide (PI), polyamide (PA), and benzocyclobutene (BOB).

18. The display of claim 8, wherein the display is an organic electroluminescence display.

* * * * *